(12) United States Patent
Maccarrone et al.

(10) Patent No.: US 6,204,722 B1
(45) Date of Patent: Mar. 20, 2001

(54) ELECTRONIC CIRCUIT FOR GENERATING A STABLE VOLTAGE SIGNAL FOR POLARIZING DURING A READING STEP UPROM MEMORY CELLS OPERATING AT LOW FEED VOLTAGE

(75) Inventors: Marco Maccarrone, Palestro; Stefano Commodaro, Bogliasco; Marcelo Carrera, Trescore; Andrea Ghilardelli, Cinisello, all of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/218,796

(22) Filed: Dec. 21, 1998

(30) Foreign Application Priority Data

Dec. 19, 1997 (IT) ................................. MI97A2811

(51) Int. Cl.⁷ ...................................................... G05F 1/10
(52) U.S. Cl. ............................................. 327/538; 327/540
(58) Field of Search .................................. 327/540, 541, 327/538, 543; 323/315

(56) References Cited

U.S. PATENT DOCUMENTS

| 5,363,336 | * | 11/1994 | Yabe | 365/226 |
| 5,434,534 | * | 7/1995 | Lucas | 327/540 |
| 6,002,294 | * | 12/1999 | Kushibe | 327/543 |

* cited by examiner

*Primary Examiner*—Toan Tran
*Assistant Examiner*—Linh Nguyen
(74) *Attorney, Agent, or Firm*—Theodore E. Galanthay; Robert Iannucci; Seed IP Law Group, PLLC

(57) ABSTRACT

An electronic circuit generates a stable voltage signal for the polarization during a reading step of a UPROM redundancy cell incorporating at least one memory element of EPROM or Flash type, having at least one terminal to be polarized, and MOS transistors which connect such memory element to a low voltage power supply reference. The circuit includes a current mirror structure with a first control branch and a second output branch. The current mirror stricture includes a first series of MOS transistors (M2, M3, M4) in said first branch between the supply reference and a ground; and a second series of transistors (M5, M6, M7) in said second branch. The circuit also includes an input terminal connected to the gate terminal of a transistor of the first series of transistors and an output terminal corresponding to an interconnection node of the second series of transistors. The stable voltage is obtained through a current which passes through at least a pair of transistors of the second series.

18 Claims, 3 Drawing Sheets

ELECTRONIC CIRCUIT FOR GENERATING A STABLE VOLTAGE SIGNAL FOR POLARIZING DURING A READING STEP UPROM MEMORY CELLS OPERATING AT LOW FEED VOLTAGE

TECHNICAL FIELD

This invention relates to a stable polarization circuit for UPROM memory cells operating at low voltage.

More specifically, but not exclusively, this invention relates to a circuit for generating polarized signals in the reading of a UPROM redundancy cell incorporating at least one element of EPROM or Flash memory, having at least one polarization terminal, and MOS transistors connecting said memory element to a low voltage source reference.

BACKGROUND OF THE INVENTION

As is well known, the manufacture of non-volatile matrixes with a memory of the so-called EPROM and Flash types has proved to have a relatively low yield.

The prior art attempted to rectify the low yield of the Flash memory production process and the solution adopted so far consists in equipping the cell matrix with additional so called redundancy, which may be used to replace faulty columns and/or rows that show malfunctions after the device has been tested.

Those skilled in the art are familiar with the design and use methodology of redundancy columns and rows as well as of the relative selection circuitry. The latter makes it possible for the memory to be readdressed in such a way as to replace the addresses containing faulty bits by those containing functional bits in the redundancy columns or rows.

At present, the constant evolution of technology and the semiconductor market trend dictate the design of memory devices capable of operating at lower and lower supply voltages.

This gives rise to a number of problems due to the fact that in order to obtain a memory device that is efficient and has a fast response time, particularly in the reading mode, even the redundancy cells and circuitry must meet certain stringent specifications. In particular, the UPROM memory cells incorporated in the selection circuitry, containing the binary code of the addresses to be set as redundant, must be designed to operate efficiently even at low voltages.

In FIG. 1, there is illustrated the basic structure of a UPROM 2 memory cell provided between a first reference voltage Vdd and a second voltage reference GND, a ground signal, for example.

Such UPROM cell comprises a memory element represented by an EPROM or Flash type cell FC having a floating gate and containing a binary code of an address to be set as redundant. This cell FC has a conduction terminal, the source terminal, directly connected to ground, while another conduction terminal, the drain terminal, is connected to the power supply Vdd by means of a complementary MOS transistor pair M1, M2.

The basic structure of the UPROM 2 cell also comprises a latch structure consisting of a first inverter I1 and a second inverter I2 each having their respective input and output terminals connected to the output and input of the other inverter.

The first transistor MOS M1 of the complementary pair is of the P-Channel type and connects the input of the first inverter I1 with the supply Vdd. The second transistor MOS M2 is of the N-Channel type and connects the input of the first inverter I1 to the drain terminal of the cell FC in a source follower configuration.

The control terminal of the FC cell receives a signal UGV, whereas to the respective control terminals G1 and G2 of transistors M1 and M2, a signal POR# and a polarization voltage signal VB are applied. The signal POR# represents the NOT form of the start and reset signal POR referred to as POWER ON RESET.

The signal POR is applied to the control terminal G3 of an enabling transistor M3 inserted between the output of the first inverter I1 and ground GND.

Inverters I1 and I2 form a latch register and transistors M1, M2 and M3 allow to effect the start-up step of said latch.

The cell FC is programmed during the testing step, i.e., when the memory devices undergo an EWS (Electrical Wafer Sort) test. Before carrying out any kind of operation on the memory device, all the cells FC of the UPROM circuitry are read, thus enabling correct addressing of the memory cells which are to be replaced.

In order to carry out the reading it is necessary to suitably polarize the terminals of the cell FC.

While operating at low supply voltages Vdd, close to 1.8 Volts, problems arise when generating and controlling the signals necessary to achieve the above mentioned polarization step.

The cells FC incorporated in the UPROM cells generally have a voltage threshold exceeding 2 V, usually of approximately 2.5 V, and a low current absorption; therefore, in order to effect the reading it is necessary to boost the supply voltage Vdd to reach an appropriate voltage level UGV to be applied to the control terminal of the Flash cell type memory element FC.

In order to carry out the reading it is also necessary to supply a correct drain voltage value VB onto the FC cell so as to avoid electrical stresses. Usually, the drain voltage level is set at 1 V.

A known technical solution to generate the voltage levels UGV and VB is described in the European Patent Application No. 95830242.2 in the name of SGS-Thomson Microelectronics S.r.l.

The hereto attached FIG. 2 illustrates an example of embodiment of a polarization circuit disclosed in that application.

Said circuit, indicated in its whole with the numeral 1, is responsible for the generation of the signal VBa to be applied to the control terminal of the transistor M2 of the UPROM 2 cell.

The level of voltage VBa must be such so as to maintain the drain potential of the memory cell FC at approximately 1 V.

Circuit 1 essentially comprises a first section for timing and a second section 8 for generating the voltage VBa.

Generation section 8, comprises a logical gate P5 of NOR type inserted in the circuit with a feedback loop 9.

The output of the logical gate P5 is connected to the control terminal of a N-channel natural transistor M10 having a conduction terminal connected to the power supply source Vdd by means of a transistor M11 and the other conduction terminal connected to ground via transistor M12 in diode mode connected in turn to another transistor M13.

The control terminal of the transistor M11 is connected to a first input A of the gate P5, whereas the node linking transistors M12 and M13 are feedback connected to the other input B of the gate P5.

The control terminal of transistor M13 is connected to the output of the first timing section.

Between the transistors M10 and M12 there is an output node U2 from which output voltage VBa is derived; Such output node U2 is connected to ground via a transistor M14 in parallel with a stray capacitor C11.

The control terminal of this latter transistor M14 is connected to the first input A of the logical gate P5.

When the gate P5 has a high logic value on one of its inputs, its output will accordingly have a low logic value, which will keep the transistor M10 switched off. If the input A is high, then the transistor M14 is switched on and maintains the value of the output node U2 at ground.

When the transistor M10 is switched on, on the contrary, current is allowed to pass through the transistors M10, M11, M12. Voltage VBa on the output U2 can reach the operating level set by the trigger threshold of gate P5 and by the threshold voltage of the transistor M12.

If the voltage VBa were to have a lower value than that indicated, the output of the gate P5 would allow the transistor M10 to conduct more current, thus increasing the output voltage value.

If, on the contrary, the voltage VBa were to exceed the chosen value, the feedback input of gate P5 would have a potential value higher than the trigger threshold of the gate itself, bringing the output to a low potential level and switching off the transistor M10. In this way VBa would be reduced until it reaches the pre-set value.

Although for various reasons this could be considered a viable solution, it does not completely fulfill the actual requirements for a correct polarization (that is biasing) of UPROM cells due to a low rejection to the rapid changes of supply voltage Vdd caused by electrostatic discharges.

It is, in fact, extremely important that voltage VBa never reaches undesired levels during electrostatic discharges.

The output voltage VBa of the circuit just described is determined by the trigger voltage of the NOR logic gate and by the threshold voltage of the MOS natural transistor M12.

Since the trigger voltage of the NOR logical gate depends on the value of the supply voltage Vdd, even the output voltage VBa will depend on and vary linearly with the voltage Vdd.

Therefore, the solutions put forward by the prior art do not offer proper rejection to the changes in the supply voltage and are not able to prevent spurious alterations (unwanted programming) in the flash memory cell incorporated in the UPROM cell.

SUMMARY OF THE INVENTION

An embodiment of this invention is a polarization circuit for an UPROM cell having such structural and functional features so as to provide proper rejection of the variations in supply voltage whilst operating at a low supply voltage.

The polarization circuit includes:
- a mirrored current structure with a first control branch and a second output branch;
- a first series of MOS transistors in the said first branch between the power supply reference and a ground;
- a second series of transistors in said second branch;
- an input terminal connected to the gate terminal of a transistor in the first series of transistors;
- an output terminal corresponding to an interconnection node of the second series of transistors;
- said stable voltage being obtained from a current which passes through at least a pair of transistors of said second series.

The features and the advantages of the polarization circuit according to this invention, will become clear from the following specification of an embodiment thereof, which is herein set as example for descriptive and non limiting purposes, with reference to the attached drawings.

BRIEF DESCRIPTION OF THE DRAWINGS

FIG. 3A shows a schematic view of an alternate polarization circuit designed according to the invention for the UPROM cell in FIG. 4.

DETAILED DESCRIPTION OF THE INVENTION

Figure 1:
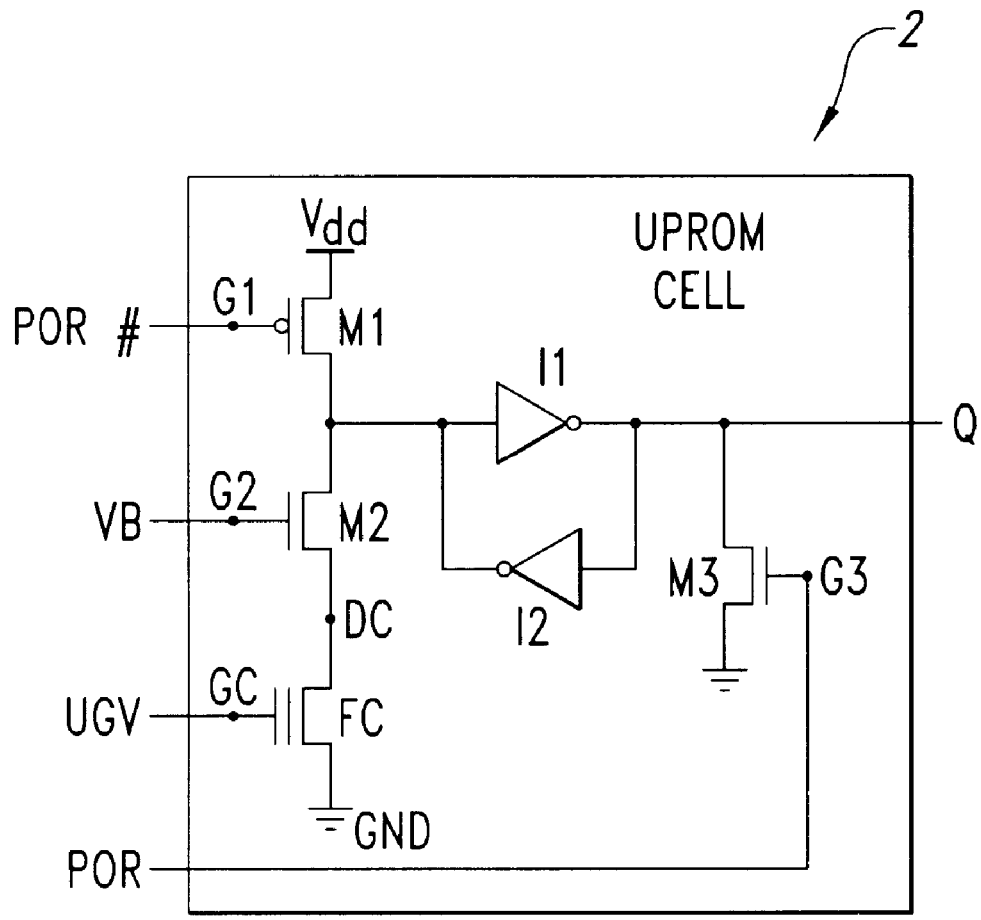
FIG. 1 shows a schematic view of an UPROM memory cell incorporating a Flash memory cell.
Figure 2:
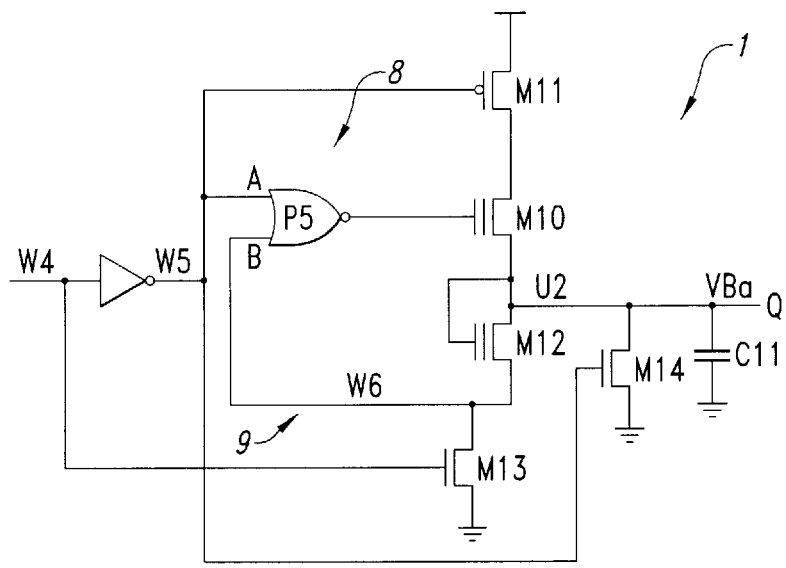
FIG. 2 shows a schematic view of a polarization circuit designed according to the prior art.
Figure 3:
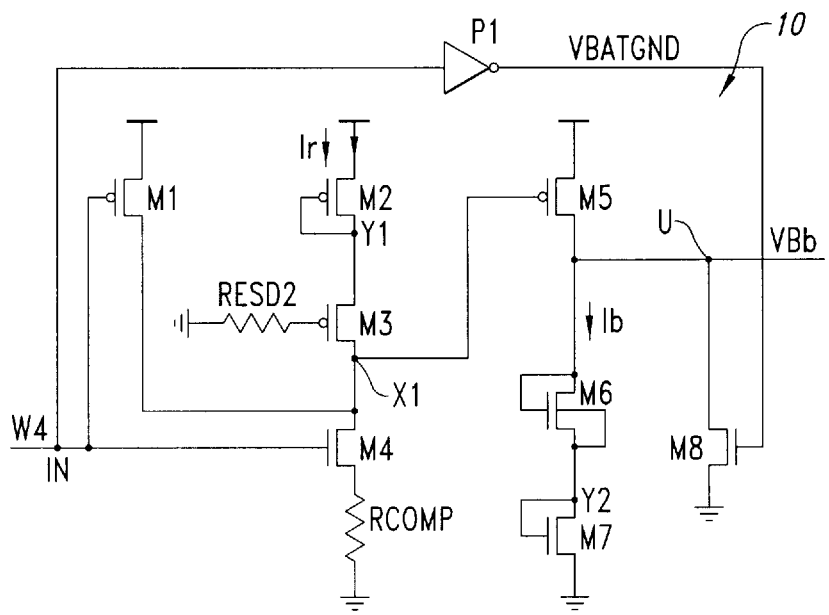
FIG. 3 shows a schematic view of a polarization circuit designed according to the invention for the UPROM cell in FIG. 1.

With reference to FIG. 3, there is schematically indicated at 10 the structure of a bias circuit produced according to an embodiment of the invention in order to supply adequate bias voltages to a redundant UPROM 2 cell of the type shown in FIG. 1.

The cell 2 is integrated, together with multiple cells of the same type, in a semiconductor memory device, particularly of the EPROM or Flash type, operating at a low supply voltage.

Such a memory device may be of the type comprising a memory cell matrix organized in rows and columns. A conventional control circuitry for selection and decodification is associated with the matrix as well.

The UPROM 2 cell has been previously described; however, attention is drawn to the fact that it is supplied by a supply voltage Vdd of about 1.8 Volts.

Referring to FIG. 3, Circuit 10 according to the invention generates a polarization voltage VBb to be applied to the UPROM cells that is stable enough, with respect to the supply voltage Vdd.

Circuit 10 comprises a current mirror structure with first 11 and a second 12 circuit branches connected between a supply voltage Vdd reference and a ground GND.

The first branch 11 includes a series of transistors M2, M3 and M4 as well as a resistor Rcomp. Branch 11 can be defined as a control branch.

Transistor M2 is a PMOS with a source terminal connected to the power supply Vdd and a gate terminal connected to the drain terminal at node Y1, so that transistor M2 is always on.

Transistor M3 is also a PMOS type transistor and it mutually connects node Y1 with the NMOS type transistor M4.

The gate terminal of the transistor M3 is connected to ground GND by means of a resistance RESD2.

The respective drain terminals of transistors M3 and M4 are mutually connected through the node X1.

Transistor M4's gate terminal is connected to an input terminal IN of the circuit 10 and directly receives an input signal W4 which is also applied to the gate terminal of a switch-off transistor M1 of PMOS type inserted between the power supply Vdd and the node X1. In particular, the drain terminal of M1 is connected to the node X1.

The second branch 12 of the circuit 10, which can be defined as the output branch, comprises a first transistor M5 and a series of two transistors M6 and M7.

The transistor M5 is a PMOS type transistor and has a gate terminal connected to the node X1 of the first branch 11.

Transistors M6 and M7 are NMOS transistors connected in series between an output terminal U of the circuit 10 and the ground GND. They are inserted in the circuit in a diode configuration and are traversed by a current Ib mirrored by the first branch 11.

Another transistor M8 of NMOS type is connected in parallel to the transistors M6 and M7 between the output terminal U and the ground. The terminal gate of the transistor M8 is connected to the input terminal IN and receives the input signal W4 through an inverter P1.

The operation of the circuit 10 according to the invention is now described in the following.

The circuit is switched on via the control signal W4. When the signal W4 has a low logic value (logic 0), the inverter P1 sets itself to a high logic value, i.e., to the power supply value Vdd.

This situation permits the transistor M8 to bring the output U of the circuit 10 to the value of ground GND. Furthermore, the PMOS transistor M1 is switched on, which brings the gate terminal of the PMOS transistor M5 to the value of Vdd through node X1, by switching it off.

Since the transistor M4 is switched off by signal W4, circuit 10 does not consume current from the power supply Vdd and, therefore, output U remains at ground value.

On the other hand, if input signal W4 is raised to a high logic value (logic 1), the transistors M1 and M8 are switched off, the latter through the output of the inverter P1 which attains ground value.

A current Ir can flow through the control branch 11. Transistors M2, M3, M4, M5, M6 and M7 are switched on allowing circuit 10 to function. The current Ir is mirrored in the output branch 12 via the transistor M5.

The stable output voltage VBb is obtained by means of the current Ib which flows through the transistors M6 and M7 connected in series. After the initial transient (due to the current required to charge the parasitics and gate capacitances) there is not current flowing toward the output U of this circuit because its load is only represented by capacitances.

In other words, the polarization voltage VBb produced by the circuit 10 is substantially given by the sum of the voltage drops Vgs of the transistors M6 and M7. This output voltage VBb is given by:

$$VBb = Vt6 + Vt7 + K2*(H2Ib)^{1/2} + K1*(H1Ib)^{1/2} \qquad (1)$$

wherein Vt6 and Vt7 are the threshold voltages of transistors M6 and M7; H1, H2 and K1, K2 are constants determined by the process parameters and by the sizes of the transistors for controlling the operating speed of the circuit. Since the transistor M3 (in FIG. 3) is always "ON" the two P-Channel (M2 and M5 in FIG. 3) have the same Vgs and M2 is diode-connected. This means that:

$$Vgs2 - VT)^{\wedge}2 = Ir/K2$$

(Where $K2 = \frac{1}{2}$ up Cox W2/L2).

If M5 has the same sizing of M2 we have:

$$K5 = W5/L5 = W2/L2 = K2$$

Therefore, the current flowing in the branch (12) is Ir.

Furthermore, if we consider the first branch 11 of circuit 10 which comprises transistors M2, M3 and M4 and assume that M2 and M5 are identical in size, it can be deduced that:

$$Ib = Ir = (Vdd - Vgs4)/Rcomp \qquad (2)$$

which, if introduced in the equation (1) demonstrates that the output voltage VBb of the circuit according to the invention varies with the square root of the power supply voltage Vdd reducing the variability of the output voltage with respect to the power supply.

In the circuit according to the invention particular attention has been given to the problem of electrostatic discharges on the power supply.

To avoid electrical stresses on the source-drain junctions of the N-channel transistors, a protective structure has been provided which comprises transistor M3 and resistor RESD2 which are not essential for the operation of circuit 1 but which permit direct connection of the NMOS transistor M4 with the node Y1. In fact, node Y1 is well coupled with the power supply Vdd and could take on particularly high and dangerous values of electric potential during an electrostatic discharge.

It will be appreciated that the drop across transistor voltage M3 may place slightly different voltage on the gate of M5 than is on the gate of M2. However, the voltage drop across M3 is not so heavy to compromise the functionality of the current mirror composed by M2 and M5. The transistor M3 is inserted only to protect the N-Channel transistor M4 from electrostatic discharge. Alternatively, the transistor M3 can be removed to connect the gate of transistor M5 directly to the gate of transistor M2 to provide a classical current mirror as shown in FIG. 3A.

Figure 4:
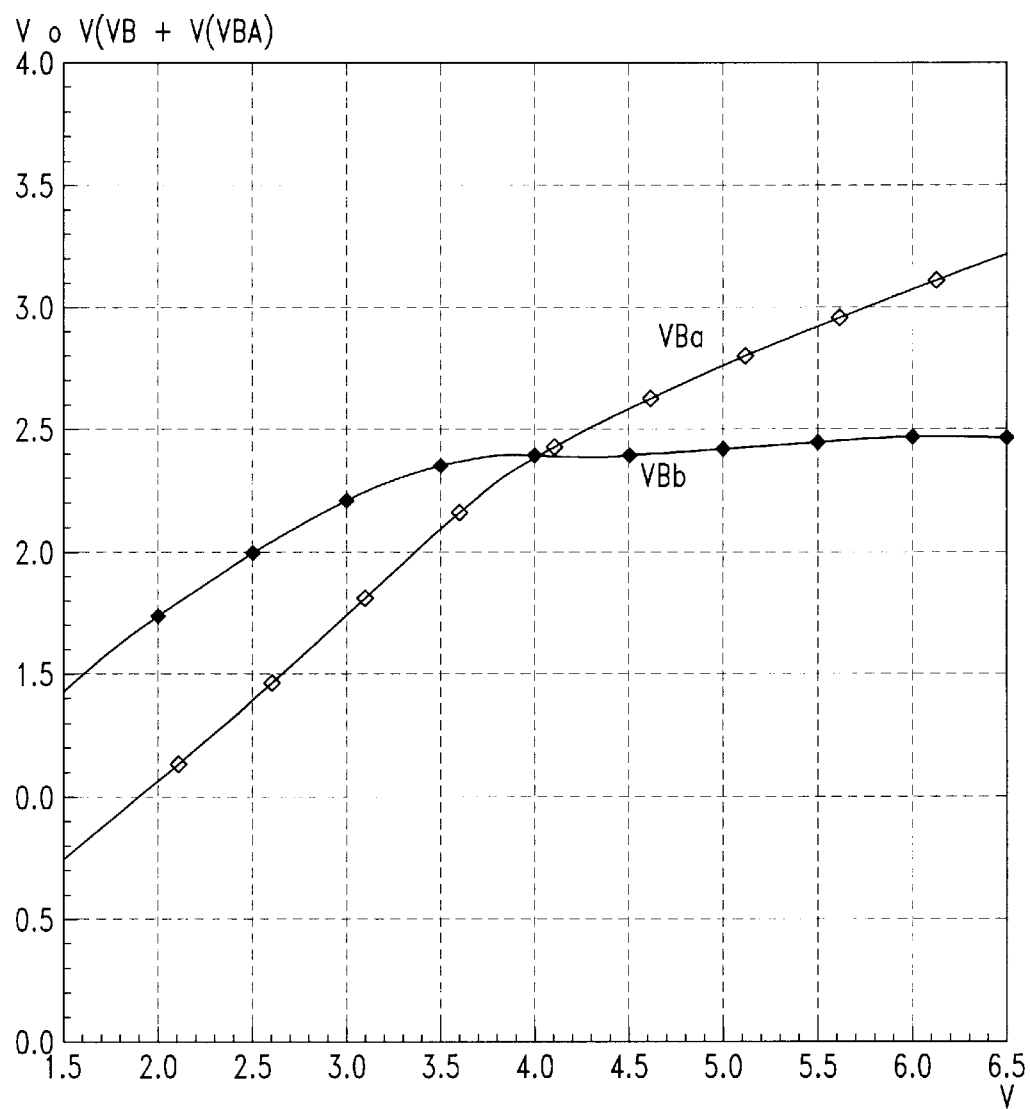
FIG. 4 is a comparative diagram of the patterns, as a function of the supply voltage Vdd, of the respective values of output voltage given in the circuits of FIGS. 2 and 3.

From a comparison of the curves of the diagrams in FIG. 4 it can be observed that for values of power supply voltage Vdd between 1.8 and 6.5 V, the polarization voltage VBb generated by circuit 1 remains within the range of 1.7 to 2.5 V.

On the other hand, the known circuit described in the background section of the present application, had a worse performance and supplied a polarization voltage VBa within 1.2 and 3.5 V in the same range of power supply.

The polarization circuit according to the present invention overcomes a problem of the prior art in a simple way, attaining numerous advantages.

The protections provided for in the circuit according to the described embodiment of invention prevent dangerous overvoltages due to electrostatic discharge. The risk of altering the information contained in the memory elements FC of the UPROM cells by a spurious programming thereof, is eliminated.

With respect to the prior art the circuit described above allows a greater stability in the generated voltages and offers better protection against the spikes produced by electrostatic discharges.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. Electronic circuit for generating a stable voltage signal for polarization during a reading step of a UPROM redundancy cell incorporating at least one memory element of EPROM or Flash type, having at least one terminal to be polarized, and MOS transistors which connect the memory element to a low voltage power supply reference, the electronic circuit comprising:
  a current mirror structure with a control branch and an output branch, the current mirror structure including:
    a first series of MOS transistors in said control branch between the supply reference and a ground; and
    a second series of transistors in said output branch;
  an input terminal connected to the gate terminal of a transistor of the first series of transistors;
  an output terminal corresponding to an interconnection node of the second series of transistors; and
  a switch-off transistor having a gate terminal connected downstream of said input terminal and a conduction terminal connected to an interconnection node between the control and output branches of the circuit;
  wherein said stable voltage signal being obtained through a current which passes through a pair of transistors of said second series of transistors.

2. Electronic circuit for generating a stable voltage signal for polarization during a reading step of a UPROM redundancy cell incorporating at least one memory element of EPROM or Flash type, having at least one terminal to be polarized, and MOS transistors which connect the memory element to a low voltage power supply reference, the electronic circuit comprising:
  a current minor structure with a control branch and an output branch, the current mirror structure including:
    a first series of MOS transistors in said control branch between the supply reference and a ground; and
    a second series of transistors in said output branch;
  an input terminal connected to the gate terminal of a transistor of the first series of transistors; and
  an output terminal corresponding to an interconnection node of the second series of transistors;
  wherein said stable voltage signal being obtained through a current which passes through a pair of transistors of said second series of transistors; wherein said first series comprises a PMOS first transistor with short circuited gate and drain terminals connected to a PMOS second transistor having a gate terminal connected to the ground via a resistance.

3. Circuit according to claim 2, wherein the control branch includes a third transistor of NMOS type that connects to the ground said second transistor via a resistance.

4. Electronic circuit for generating a stable voltage signal for polarization during a reading step of a UPROM redundancy cell incorporating at least one memory element of EPROM of Flash type, having at least one terminal to be polarized, and MOS transistor which connect the memory element to a low voltage power supply reference, the electronic circuit comprising:
  a current mirror structure with a control branch and an output branch, the current mirror structure including:
    a first series of MOS transistors in said control branch between the supply reference and a ground; and
    a second series of transistors in said output branch;
  an input terminal connected to the gate terminal of a transistor of the first series of transistors;
  an output terminal corresponding to an interconnection node of the second series of transistors; and
  a further transistor which connects to the ground said output terminal, said further transistor having a gate terminal connected to the input terminal via an inverter;
  wherein said stable voltage signal being obtained through a current which passes through a pair of transistors of said second series of transistors.

5. Circuit according to claim 1, wherein said second series of transistors comprises a PMOS transistor having a gate terminal connected to an interconnection node of transistors of the first series.

6. Circuit according to claim 1, wherein a pair of transistors is disposed between said output terminal and the ground, each transistor of the pair being in diode configuration.

7. Circuit according to claim 6, wherein said pair comprises NMOS transistors.

8. Circuit according to claim 1, wherein said switch-off transistor is of PMOS type.

9. An electronic circuit for generating a stable voltage signal, comprising:
  an input terminal that receives an input control signal;
  an output terminal at which the stable voltage signal is produced;
  a current mirror having control and output branches, the control branch including a control node and a control switch having a control terminal coupled to the input terminal and a conduction terminal coupled to the control node, the output branch having an output node coupled to the output terminal and a controlled switch having a control terminal coupled to the control node of the control branch, the control switch turning on the controlled switch to produce the stable voltage signal in response to the input control signal being at a first logic level; and
  an output transistor having a control terminal coupled to the input terminal, a first conduction terminal coupled to the output terminal, and a second conduction terminal coupled to a ground reference, the output transistor being structured to electrically connect the output terminal to the ground reference in response to the input control signal being at a second logic level.

10. An electronic circuit for generating a stable voltage signal, comprising:
  an input terminal that receives an input control signal;
  an output terminal at which the stable voltage signal is produced;
  a current mirror having control and output branches, the control branch including a control node and a control switch having a control terminal coupled to the input terminal and a conduction terminal coupled to the control node, the output branch having an output node coupled to the output terminal and a controlled switch having a control terminal coupled to the control node of the control branch, the control switch turning on the controlled switch to produce the stable voltage signal in response to the input control signal being at a first logic level; and
  a switch-off transistor having a control terminal coupled to the input terminal, a first terminal coupled to a voltage reference, and a second terminal coupled to the control node of the control branch, the switch-off transistor turning off the controlled switch in response to the input control signal being at a second logic level.

11. The electronic circuit of claim 9 wherein the control branch includes a resistor coupled between the control transistor and voltage reference, the control transistor electrically connecting the control node to the voltage reference via the resistor in response to the input control signal being at the first logic level.

12. An electronic circuit for generating a stable voltage signal, comprising:

an input terminal that receives an input control signal;

an output terminal at which the stable voltage signal is produced; and a current mirror having control and output branches, the control branch including a control node and a control switch having a control terminal coupled to the input terminal and a conduction terminal coupled to the control node, the output branch having an output node coupled to the output terminal and a controlled switch having a control terminal coupled to the control node of the control branch, the control switch turning on the controlled switch to produce the stable voltage signal in response to the input control signal being at a first logic level; wherein the control branch includes a first transistor coupled to a first voltage reference, a second transistor coupled between the first transistor and the control node, and the control switch is coupled between the control node and a second voltage reference.

13. The electronic circuit of claim 12 wherein the control branch further includes a resistor coupled between the second voltage reference and a control terminal of the second transistor.

14. The electronic circuit of claim 9 wherein the control and output branches are both coupled to a first voltage reference and the output branch further includes a further transistor coupled between the output node and a second voltage reference.

15. The electronic circuit of claim 14 wherein the further transistor is a first transistor diode and the output branch further includes a second transistor diode coupled between the first transistor diode and the second voltage reference.

16. An electronic circuit for generating a stable voltage signal, comprising:

an input terminal that receives an input control signal;

an output terminal at which the stable voltage signal is produced; and a current mirror having control and output branches, the control branch including a control node and a control switch having a control terminal coupled to the input terminal and a conduction terminal coupled to the control node, the output branch having an output node coupled to the output terminal and a controlled switch having a control terminal coupled to the control node of the control branch, the control switch turning on the controlled switch to produce the stable voltage signal in response to the input control signal being at a first logic level; wherein the control branch includes a first transistor coupled to a first voltage reference, a second transistor coupled between the first transistor and the control node, and a resistor coupled between the control switch and a second voltage reference; and the control branch includes third and fourth transistors coupled between the output node and the second voltage reference and the controlled switch is coupled between the first voltage reference and the output node; the electronic circuit further comprising a fifth transistor having a control terminal coupled to the input terminal, a first conduction terminal coupled to the first voltage reference, and a second conduction terminal coupled to the control node.

17. A method of producing a stable voltage signal for controlling an UPROM memory cell, the method comprising:

tuning on a control switch of a first circuit branch of a current mirror in response to an input control signal going to a first logic level, the turned on control switch establishing a first current in the first circuit branch;

creating in a second circuit branch of the current mirror a current that is substantially equal to the first current in the first current branch in response to the control switch being turned on;

providing a resistance in the second circuit branch so as to create the stable voltage signal at an output node of the second circuit branch, the resistance being between a first voltage reference and the output node; and turning off a switch-off transistor, coupled between a second voltage reference and a conduction terminal of the control switch, in response to the input control signal going to the first logic level.

18. The method of claim 17 wherein the creating act includes turning on a controlled transistor of the second branch via a control voltage created in the first branch by the first current.

* * * * *